March 7, 1961 L. D. ARMSTRONG 2,974,073

METHOD OF MAKING PHOSPHORUS DIFFUSED SILICON SEMICONDUCTOR DEVICES

Filed Dec. 4, 1958

INVENTOR.
LORNE D. ARMSTRONG
BY
W. S. Hill
AGENT 2,974,073

METHOD OF MAKING PHOSPHORUS DIFFUSED SILICON SEMICONDUCTOR DEVICES

Lorne D. Armstrong, Somerville, N.J., assignor to Radio Corporation of America, a corporation of Delaware Filed Dec. 4, 1958, Ser. No. 778,173

6 Claims. (Cl. 148—1.5)

Figure 1:
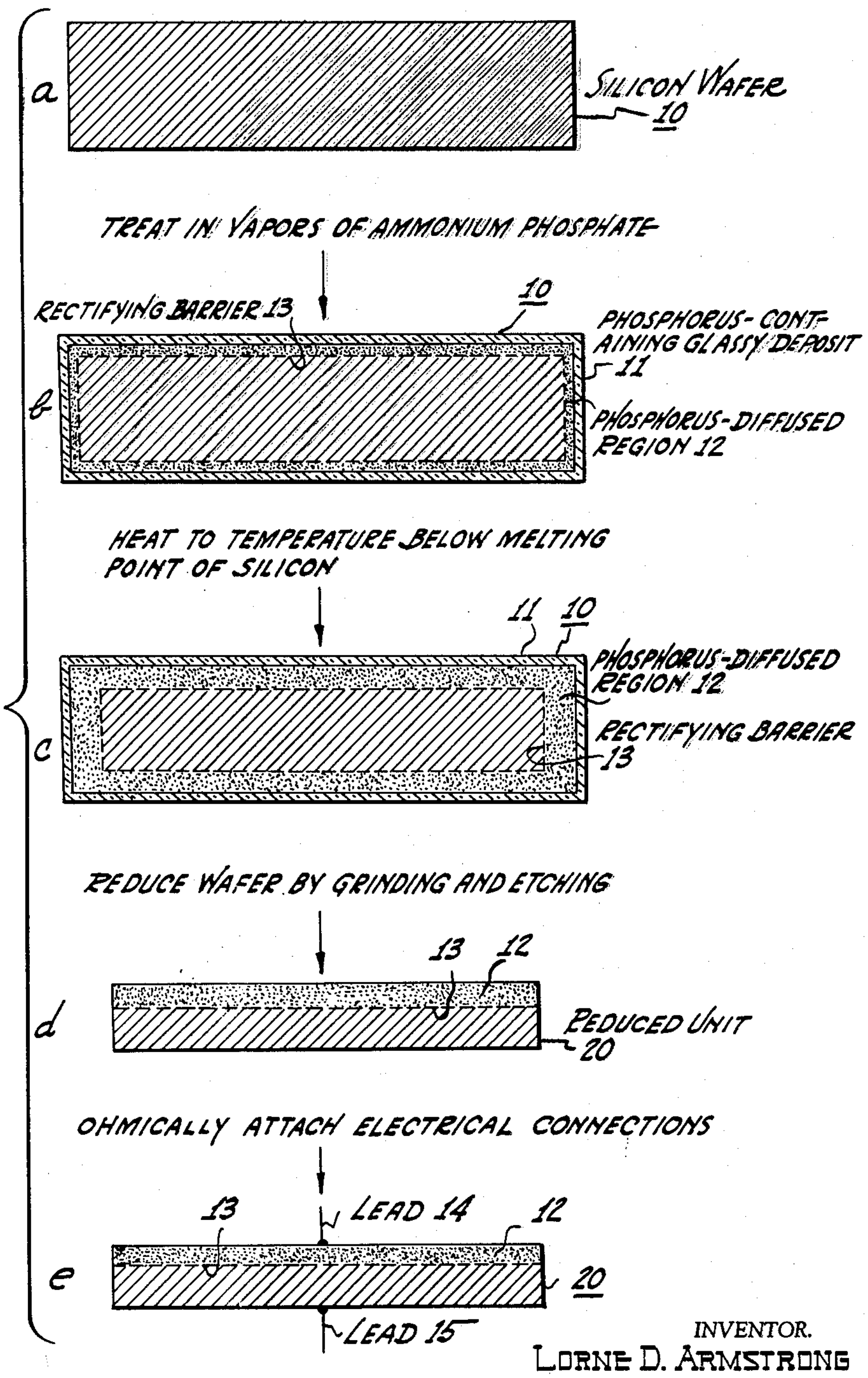

This invention relates to an improved method of making diffusion type PN junctions in semiconductive bodies. More particularly, the invention relates to an improved method of making rectifying barriers by diffusing phosphorus into a body of semiconductive silicon.

Silicon devices containing a diffused PH junction have been made by heating a P-conductivity type silicon wafer in an ambient containing a donor, for example a phosphorus compound such as phosphorus pentoxide. The phosphorus pentoxide forms a glassy film over the surface of the wafer, and diffuses somewhat from the film into the wafer. After a sufficient thickness of film has been deposited on the wafer, the ambient is changed to an inert or oxidizing atmosphere such as line nitrogen, and heating is continued so as to diffuse phosphorus from the glassy film into the wafer to a desired depth. A phosphorus-containing region is thereby formed at the surface of the wafer. Since phosphorus is a donor in silicon, the conductivity of this phosphorus-containing region is converted to N-conductivity type, and the boundary between the phosphorus diffused N-type surface region and the P-type bulk of the wafer forms a rectifying barrier or PN junction.

Diffusion techniques utilizing phosphorus pentoxide as described above have certain inherent disadvantages. One disadvantage is that considerable trouble must be undertaken to eliminate traces of moisture from the system, since the phosphorus pentoxide tends to combine readily with water under these conditions to form gummy deposits. The deposits are believed to be residues of phosphate compounds which have probably lost water. A second draw-back is that the concentration of phosphorus in the glassy surface layer tends to vary considerably. This is undesirable since it introduces variations in the concentration and depth of diffusion of phosphorus into the wafer, and hence in the thickness of the N-type surface region formed, so that mass production runs are not reproducible. A third disadvantage of the above technique is that the phosphorus diffusion front in the wafer is not flat. The phosphorus tends to diffuse into the wafer more rapidly in some locations than in others, thus producing bumps or spikes in the diffusion front. This irregular diffusion front adversely affects the electrical parameters of the resulting device, such as the breakdown voltage of the junction.

An important feature of the present invention is the discovery of an improved method of diffusing phosphorus into semi-conductive silicon, which method may be performed in a moisture-containing ambient such as ordinary air.

An object of the present invention is to provide an improved method of fabricating rectifying barriers in a body of semiconductive silicon.

Another object of the invention is to provide an improved method of diffusing a donor into a body of semiconductive silicon.

Still another object of the present invention is to provide an improved method of introducing PN junctions in a body of P-conductivity type silicon.

Yet another object of the present invention is to provide an improved method of fabricatiing a semiconductive silicon device containing at least one N-type region in which phosphorus is the predominant donor.

But another object is to provide an improved method of diffusing phosphorus into silicon so as to obtain flat junctions and reproducible results.

These and other objects are accomplished by the improved method of the instant invention which comprises treating a wafer of semiconductive silicon in the vapors of ammonium phosphate. The vapors form a glassy phosphorus-containing surface film over the wafer. Simultaneously, some phosphorus diffuses from the film into the wafer to form a phosphorus-diffused N-type surface layer on said wafer. Thereafter, the wafer may be heated so as to diffuse additional phosphorus from the surface film into the wafer, and thereby deepen the phosphorus-diffused surface layer.

The invention will be described in greater detail by reference to the accompanying drawing, in which the single figure illustrates successive steps in the fabrication of a semiconductive silicon device made in accordance with the present invention.

A preferred example of the method will illustrate the preparation of a single-junction silicon semiconductor device of the diode type. However, it is to be understood that the method is equally applicable to making multiple junction devices such as transistors, and that the end product need not necessarily be a diode.

*Example*

Referring to Figure 1*a*, a wafer 10 of semiconductive silicon is prepared by conventional methods. For example, a monocrystalline ingot is formed of highly purified silicon. The ingot is cut into transverse slices, and the slices are diced to form silicon wafers of the desired dimensions. The exact size of the wafer is not critical. In this example, the wafer 10 is made of P-conductivity type silicon about 100 mils square, 10 mils thick, and having a resistivity of about 3 to 10 ohm centimeters.

Referring to Figure 1*b*, the wafer is heated in the vapors or fumes of ammonium phosphate so that a film or coating 11 is formed over the surface of the wafer. The coating or film 11 is of a glassy nature and its exact composition is unknown, but the film does contain phosphorus. Simultaneously some phosphorus diffuses from the film or deposit 11 into the wafer 10, forming a thin phosphorus-diffused surface layer or region 12 adjacent the coating 11. Since the phosphorus-diffused region 12 is converted to N-conductivity type, a rectifying barrier 13 is formed at the interface between the phosphorus-diffused surface layer 12 and the P-conductivity type bulk of the wafer. It will be understood that the term "ammonium phosphate" as used in the instant specification and appended claims is generic to both ammonium monohydrogen phosphate, $(NH_4)_2HPO_4$ and ammonium dihydrogen phosphate, $(NH_4)H_2PO_4$. Either of these ammonium phosphates may be used in the practice of the invention.

A convenient method of performing this step is to utilize a two-zone furnace having a cool zone kept at about 400° C. to 900° C. and a hot zone maintained at about 1000° C. to 1350° C. In this example, 10 grams of ammonium mono-hydrogen phosphate are placed in a fused quartz boat which is positioned in the cool zone of the furnace, while the P-conductivity type silicon wafer is placed in the hot zone of the furnace. In the temperature range of the cool zone, the ammonium phosphate is vaporized. It is believed that the vapors may include some pyrolytic decomposition products of ammonium phosphate. A current of an oxidizing gas, such as air, oxygen, or line nitrogen is preferred to sweep the ammonium phosphate vapors into the hot zone. In this example, a current of line nitrogen, which contains some moisture and oxygen, is used to sweep the vapors over the wafer. The vapors deposit on the silicon wafer and form a glassy phosphorus-containing layer. Simultaneously, as mentioned above, some phosphorus diffuses into the wafer surface. In this example, the ammonium phosphate is maintained at 600° C. in the cool zone, while the wafer 10 is treated in the hot zone for about 30 minutes at about 1200° C. Under these conditions, the phosphorus-diffused surface layer 12 is about 0.25 mil thick.

The concentration of phosphorus in the glassy film 11 thus produced is high, but more important, it is stable and reproducible. If a surface film 11 having a lower concentration of phosphorus is desired, the temperature at which the ammonium phosphate is maintained in the cool zone of the furnace is reduced. Alternatively, the amount of ammonium phosphate in the system, or the rate at which the vapors are swept into the hot zone, or a combination of these parameters, may be reduced.

Referring to Figure 1*c*, the wafer is reheated so as to deepen the phosphorus-diffused surface layer 12 by diffusing additional phosphorus from the surface film 11 into the wafer. This step is preferably performed in an oxidizing atmosphere such as air, oxygen, or line nitrogen. In this example, the wafer is reheated in oxygen for 16 hours at 1300° C. The diffusion constant of phosphorus in silicon being known, and the concentration of phosphorus in film 11 being stable and reproducible, the method of this invention enables close control of the thickness of the phosphorus-diffused region 12 by controlling both the time and temperature of the deposition step and the subsequent reheating step. In this example, the thickness of the phosphorus-diffused layer 12 produced in the wafer 10 is increased by the reheating step to 2.5 mils. As the layer 12 is N-type, while the bulk of the wafer is P-type, the rectifying barrier or PN junction 13 is now 2.5 mils below the wafer surface at the interface between the phosphorus-diffused layer 12 and the P-type bulk of the wafer 10.

Referring to Figure 1*d*, the surface film 11 is removed by grinding, or by etching with concentrated hydrofluoric acid. The phosphorus-diffused region 12 is removed from one major wafer face by grinding, or etching with a mixture of hydrofluoric and nitric acids. The phosphorus-diffused ends of the wafer are also removed by grinding, leaving the reduced unit 20 smaller than the original wafer. Alternatively, the wafer may be cut in half between two major wafer faces so as to produce two units similar to 20. The unit may be lightly etched after grinding so as to leave a crystallographically undisturbed surface.

Referring to Figure 1*e*, a lead 14 is connected by any suitable method to the phosphorus-diffused N-type region 12. For example, an inert metal such as rhodium is plated on a portion of the N-type region 12 to form a coating, and the lead wire is soldered to the coating. Another lead wire 15 is similarly connected to the opposite face of the wafer. The device may then be mounted and encapsulated by conventional methods.

While the device thus made is a diode rectifier, it will be understood by those skilled in the art that the invention may also be utilized to fabricate unipolar devices and multiple junction devices such as transistors. In the above example, P-type silicon was used as the starting material, but this was by way of illustration, and not a limitation. It is equally feasible to begin with an intrinsic wafer in the practice of the invention, so as to form an I-N junction, or to begin with an N-type silicon wafer to form an N-N+ junction. If a very thin N-type region is desired, the step of reheating the wafer to deepen the phosphorus-diffused surface layer may be omitted. Other modifications may be made without departing from the spirit and scope of the invention.

What is claimed is:

1. The method of introducing a rectifying barrier in a silicon wafer, comprising the steps of heating said wafer to a temperature of about 1000° C. to 1350° C. in vapors of ammonium phosphate so as to simultaneously form a phosphorus-containing film and a phosphorus-diffused surface layer on said wafer.

2. The method of introducing a rectifying barrier in a silicon wafer, comprising the steps of heating said wafer to a temperature of about 1000° C. to 1350° C. in vapors of ammonium phosphate so as to simultaneously form a phosphorus-containing film and a phosphorus-diffused surface layer on said wafer, and subsequently heating said wafer to a temperature of about 1000° C. to 1350° C. so as to deepen said phosphorus-diffused surface layer.

3. The method of introducing a rectifying barrier in a silicon wafer, comprising the steps of heating said wafer to a temperature of about 1000° C. to 1350° C. in vapors of ammonium mono-hydrogen phosphate so as to simultaneously form a glassy phosphorus-containing film and a phosphorus-diffused surface layer on said wafer.

4. The method of introducing a rectifying barrier in a silicon wafer, comprising the steps of heating said wafer to a temperature of about 1000° C. to 1350° C. in vapors of ammonium dihydrogen phosphate so as to simultaneously form a glassy phosphorus-containing film and a phosphorus-diffused surface layer on said wafer, and subsequently heating said wafer to a temperature of about 1000° C. to 1350° C. so as to deepen said phosphorus-diffused surface layer.

5. The method of forming a PN junction in a P-conductivity type silicon wafer, comprising the steps of heating said wafer in vapors of ammonium phosphate at a temperature between about 1000° C. and 1350° C. so as to simultaneously form a phosphorus-containing film and a phosphorus-diffused surface layer on said wafer, and subsequently heating said wafer at a temperature between 1000° C. and 1350° C. so as to deepen said phosphorus-diffused surface layer.

6. The method of fabricating a semiconductive device comprising the steps of heating solid ammonium phosphate at a temperature of about 400° C. to 900° C. in the cool zone of a two-zone furnace so as to form ammonium phosphate vapors, sweeping said vapors by means of an oxidizing gas into the hot zone of said furnace, heating a p-Conductivity type monocrystalline silicon wafer in said vapors in said hot zone at a temperature of about 1000° C. to 1350° C. so as to simultaneously form a glassy phosphorus-containing film and a phosphorus-diffused surface layer on said wafer, and subsequently reheating said wafer to a temperature of about 1000° C. to 1350° C. so as to deepen said phosphorus-diffused surface layer.

References Cited in the file of this patent

UNITED STATES PATENTS

| | | |
|---|---|---|
| 2,804,405 | Derick et al. | Aug. 27, 1957 |
| 2,861,018 | Fuller et al. | Nov. 18, 1958 |
| 2,873,221 | Nijland et al. | Feb. 10, 1959 |